(12) United States Patent
Kyung et al.

(10) Patent No.: US 7,519,895 B2
(45) Date of Patent: Apr. 14, 2009

(54) CHANNEL ENCODING/DECODING APPARATUS AND METHOD USING A PARALLEL CONCATENATED LOW DENSITY PARITY CHECK CODE

(75) Inventors: Gyu-Bum Kyung, Seoul (KR); Hong-Sil Jeong, Incheon (KR); Jae-Yoel Kim, Gunpo-si (KR)

(73) Assignee: Samsung Electronics Co., LTD (KR)

( * ) Notice: Subject to any disclaimer, the term of this patent is extended or adjusted under 35 U.S.C. 154(b) by 362 days.

(21) Appl. No.: 10/988,900

(22) Filed: Nov. 15, 2004

(65) Prior Publication Data
US 2005/0149842 A1    Jul. 7, 2005

(30) Foreign Application Priority Data
Nov. 14, 2003   (KR)   ............... 10-2003-0080738

(51) Int. Cl.
H03M 13/00   (2006.01)
(52) U.S. Cl. .................. 714/780; 714/800; 714/794
(58) Field of Classification Search .......... 714/780, 714/800, 752, 801, 758, 794, 790, 760, 799; 375/341
See application file for complete search history.

(56) References Cited

U.S. PATENT DOCUMENTS

| | | | |
|---|---|---|---|
| 5,204,876 A * | 4/1993 | Bruckert et al. | 375/130 |
| 7,000,174 B2 * | 2/2006 | Mantha et al. | 714/790 |
| 2002/0136317 A1 * | 9/2002 | Oelcer et al. | 375/261 |
| 2003/0104788 A1 * | 6/2003 | Kim | 455/67.3 |
| 2004/0057575 A1 | 3/2004 | Zhang et al. | |
| 2004/0123229 A1 | 6/2004 | Kim et al. | |

FOREIGN PATENT DOCUMENTS

| | | |
|---|---|---|
| EP | 1 379 001 | 1/2004 |
| JP | 2003-244109 | 8/2003 |
| JP | 2005-277784 | 10/2005 |

OTHER PUBLICATIONS

Futaki et al., "Low-density parity-check (LDPC) coded MIMO systems with iterative turbo decoding", Vehicular Technology Conference, 2003.
Behairy et al., "Parallel Concatenated Gallager Codes", Electronic Letters, Nov. 23, 2000, vol. 36, No. 24, pp. 2025-2026.

(Continued)

*Primary Examiner*—M. Mujtaba K Chaudry
*Assistant Examiner*—Fritz Alphonse
(74) *Attorney, Agent, or Firm*—The Farrell Law Firm, PC

(57) ABSTRACT

A channel encoding apparatus using a parallel concatenated low density parity check (LDPC) code. A first LDPC encoder generates a first component LDPC code according to information bits received. An interleaver interleaves the information bits according to a predetermined interleaving rule. A second LDPC encoder generates a second component LDPC code according to the interleaved information bits. A controller performs a control operation such that the information bits, the first component LDPC code which is first parity bits corresponding to the information bits, and the second component LDPC code which is second parity bits corresponding to the information bits are combined according to a predetermined code rate.

12 Claims, 6 Drawing Sheets

OTHER PUBLICATIONS

Behairy et al., "Analysis and design of parallel concatenated Gallager codes", Electronic Letters, Aug. 29, 2002, vol. 38, No. 18, pp. 1039-1040.

Behairy et al., "On the Design, Simulation and Analysis of Parallel Concatenated Gallager Codes", 2002 IEEE, pp. 1850-1854.

Behairy et al., "Parallel Concatenated Gallager Codes for CDMA Applications", 2001 IEEE, pp. 1002-1006.

Berrou et al., "Near Optimum Error Correcting Coding and Decoding: Turbo Codes", 1996 IEEE, pp. 1261-1271.

Lu et al., "Turbo Design for LDPC Codes with Large Girth", 2003 IEEE, pp. 90-94.

Bresnan, "Construction of LDPC Codes", May 29, 2003.

Acikel et al., "Punctured Turbo-Codes for BPSK/QPSK Channels", 1999 IEEE, pp. 1315-1323.

* cited by examiner $$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}$$

$$M = \begin{bmatrix} 1 & 0 & 1 & 0 & 1 & 0 & 1 & 1 \\ 1 & 0 & 1 & 1 & 0 & 1 & 1 & 1 \\ 0 & 1 & 1 & 1 & 1 & 1 & 0 & 1 \\ 0 & 1 & 0 & 1 & 1 & 0 & 1 & 1 \\ 0 & 0 & 0 & 0 & 0 & 1 & 1 & 1 \end{bmatrix}$$

$$M' = \begin{bmatrix} 1 & 1 & 0 & 1 & 0 & 1 & 0 & 1 \\ 1 & 1 & 1 & 0 & 1 & 1 & 0 & 1 \\ 1 & 0 & 1 & 1 & 1 & 1 & 1 & 0 \\ 1 & 1 & 0 & 1 & 1 & 0 & 1 & 0 \\ 1 & 1 & 1 & 0 & 0 & 0 & 0 & 0 \end{bmatrix}$$

CHANNEL ENCODING/DECODING APPARATUS AND METHOD USING A PARALLEL CONCATENATED LOW DENSITY PARITY CHECK CODE

PRIORITY

This application claims priority under 35 U.S.C. § 119 to an application entitled "Channel Encoding/decoding Apparatus and Method Using A Parallel Concatenated Low Density Parity Check Code" filed in the Korean Intellectual Property Office on Nov. 14, 2003 and assigned Serial No. 2003-80738, the contents of which are incorporated herein by reference.

BACKGROUND OF THE INVENTION

1. Field of the Invention

The present invention relates generally to a channel encoding/decoding apparatus and method, and in particular, to a channel encoding/decoding apparatus and method using a parallel concatenated low density parity check codes.

2. Description of the Related Art

With the rapid progress of a mobile communication system, technology for transmitting a large volume of data at and up to a capacity level presently available in wired networks must be developed for a wireless network. As a high-speed, high-capacity communication system capable of processing and transmitting various information such as image data and radio data as well as simple voice service data is required, it is necessary to increase the system transmission efficiency using an appropriate channel coding scheme in order to improve the system performance. However, a mobile communication system inevitably experiences errors occurring due to noise, interference and fading according to channel conditions during data transmission. The occurrence of errors causes a loss of information data.

In order to reduce the information data loss due to the occurrence of errors, it is possible to improve reliability of the mobile communication system by using various error-control schemes. The most popularly used error-control scheme uses an error-correcting code. A description will now be made of a turbo code and a low density parity check (LDPC) code, which are typical error correcting codes.

A. Turbo Code

It is well known that the turbo code is superior in performance gain to a convolutional code conventionally used for error correction, during high-speed data transmission. The turbo code is advantageous in that it can efficiently correct an error caused by noises generated in a transmission channel, thereby increasing the reliability of the data transmission.

B. LDPC Code

The LDPC code can be decoded using an iterative decoding algorithm based on a sum-product algorithm on a factor graph. Because a decoder for the LDPC code uses the sum-product algorithm-based iterative decoding algorithm, it is lower in complexity to a decoder for the turbo code. In addition, the decoder for the LDPC code is easy to implement with a parallel processing decoder, compared with the decoder for the turbo code.

Shannon's channel coding theorem shows that reliable communication is possible only at a data rate not exceeding a channel capacity. However, Shannon's channel coding theorem has proposed no detailed channel encoding/decoding method for supporting a data rate up to the maximum channel capacity limit. Generally, although a random code having a very large block size shows performance approximating a channel capacity limit of Shannon's channel coding theorem, when a MAP (Maximum A Posteriori) or ML (Maximum Likelihood) decoding scheme is used, it is actually impossible to implement the decoding scheme because of its heavy calculation load.

The turbo code was proposed by Berrou, Glavieux and Thitimajshima in 1993, and has superior performance approximating a channel capacity limit of Shannon's channel coding theorem. The proposal of the turbo code triggered active research on iterative decoding and graphical expression of codes, and LDPC codes proposed by Gallager in 1962 have been newly spotlighted in the research. Cycles exist on a factor graph of the turbo code and the LDPC code, and it is well known that iterative decoding on the factor graph of the LDPC code where cycles exist is suboptimal. Also, it has been experimentally proven that the LDPC code has excellent performance through iterative decoding. The LDPC code known to have the highest performance ever shows performance having a difference of only about 0.04 [dB] at a channel capacity limit of Shannon's channel coding theorem at a bit error rate (BER) $10^{-5}$, using a block size $10^{7}$. In addition, although an LDPC code defined in Galois Field (GF) with q>2, i.e., GF(q), increases in complexity in its decoding process, it is much superior in performance to a binary code. However, there has been provided no satisfactory theoretical description of successful decoding by an iterative decoding algorithm for the LDPC code defined in GF(q).

The LDPC code, proposed by Gallager, is defined by a parity check matrix in which major elements have a value of 0 and minor elements except the elements having the value of 0 have a value of non-0, e.g., 1. For example, an (N, j, k) LDPC code is a linear block code having a block length N, and is defined by a sparse parity check matrix in which each column has j elements having a value of 1, each row has k elements having a value of 1, and all of the elements except for the elements having the value of 1 all have a value of 0.

An LDPC code in which a weight of each column in the parity check matrix is fixed to 'j' and a weight of each row in the parity check matrix is fixed to 'k' as stated above, is called a "regular LDPC code." Herein, the "weight" refers to the number of elements having a non-zero value among the elements constituting the generating matrix and parity check matrix. Unlike the regular LDPC code, an LDPC code in which the weight of each column in the parity check matrix or the weight of each row in the parity check matrix are not fixed is called an "irregular LDPC code." It is generally known that the irregular LDPC code is superior in performance to the regular LDPC code. However, in the case of the irregular LDPC code, because the weight of each column or the weight of each row in the parity check matrix are not fixed, i.e., are irregular, the weight of each column in the parity check matrix or the weight of each row in the parity check matrix must be properly adjusted in order to guarantee the superior performance.

With reference to FIG. 1, a description will now be made of a parity check matrix of an (8, 2, 4) LDPC code as an example of an (N, j, k) LDPC code.

FIG. 1 is a diagram illustrating a parity check matrix of a general (8, 2, 4) LDPC code. Referring to FIG. 1, a parity check matrix H of the (8, 2, 4) LDPC code is comprised of 8 columns and 4 rows, wherein a weight of each column is fixed to 2 and a weight of each row is fixed to 4. Because the weight of each column and the weight of each row in the parity check matrix are regular as stated above, the (8, 2, 4) LDPC code illustrated in FIG. 1 becomes a regular LDPC code.

FIG. 2 is a diagram illustrating a factor graph of the (8, 2, 4) LDPC code of FIG. 1. Referring to FIG. 2, a factor graph of the (8, 2, 4) LDPC code is comprised of 8 variable nodes of $x_1$ 211, $x_2$ 213, $x_3$ 215, $x_4$ 217, $x_5$ 219, $x_6$ 221, $x_7$ 223 and $x_8$ 225, and 4 check nodes 227, 229, 231 and 233. When an element having a value of 1, i.e., a non-zero value, exists at a point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight as described above, it is possible to perform decoding through iterative decoding even in a block code having a relatively long length, that exhibits performance approximating a capacity limit of a Shannon channel, such as a turbo code, while continuously increasing a block length of the block code. MacKay and Neal have proven that an iterative decoding process of an LDPC code using a flow transfer scheme is approximate to an iterative decoding process of a turbo code in performance.

In order to generate a high-performance LDPC code, the following conditions should be satisfied.

(1) Cycles on a Factor Graph of an LDPC Code Should be Considered.

The term "cycle" refers to a loop formed by the edges connecting the variable nodes to the check nodes in a factor graph of an LDPC code, and a length of the cycle is defined as the number of edges constituting the loop. A cycle being long in length means that the number of edges connecting the variable nodes to the check nodes constituting the loop in the factor graph of the LDPC code is large. In contrast, a cycle being short in length means that the number of edges connecting the variable nodes to the check nodes constituting the loop in the factor graph of the LDPC code is small.

As cycles in the factor graph of the LDPC code become longer, the performance efficiency of the LDPC code increases, for the following reasons. That is, when long cycles are generated in the factor graph of the LDPC code, it is possible to prevent performance degradation such as an error floor occurring when too many cycles with a short length exist on the factor graph of the LDPC code.

(2) Efficient Encoding of an LDPC Code Should be Considered.

It is difficult for the LDPC code to undergo real-time encoding compared with a convolutional code or a turbo code because of its high encoding complexity. In order to reduce the encoding complexity of the LDPC code, a Repeat Accumulate (RA) code has been proposed. However, the RA code also has a limitation in reducing the encoding complexity of the LDPC code. Therefore, efficient encoding of the LDPC code should be considered.

(3) Degree Distribution on a Factor Graph of an LDPC Code Should be Considered.

Generally, an irregular LDPC code is superior in performance to a regular LDPC code, because a factor graph of the irregular LDPC code has various degrees. The term "degree" refers to the number of edges connected to the variable nodes and the check nodes in the factor graph of the LDPC code. Further, the phrase "degree distribution" on a factor graph of an LDPC code refers to a ratio of the number of nodes having a particular degree to the total number of nodes. It has been proved by Richardson that an LDPC code having a particular degree distribution is superior in performance.

As described above, it is well known that the LDPC code, together with the turbo code, is superior in a performance gain for high-speed data transmission, and the LDPC code is advantageous in that it can efficiently correct errors caused by noises generated in a transmission channel, thereby increasing the reliability of the data transmission. However, the LDPC code is inferior in a point of view of code rate. That is, because the LDPC code has a relatively high code rate, it is not free from the point of view of the code rate. Conventionally, the LDPC code is only generated in high code rate because of a character of the LDPC code. It is difficult to generate a LDPC code with a relatively low code rate, so the LDPC code is not free from the point of view of the code rate.

In the case of current LDPC codes, most have a code rate of 1/2 and only some have a code rate of 1/3. The limitation in code rate exerts a fatal influence on high-speed, high-capacity data communication. Of course, although a degree distribution representing the best performance can be calculated using a density evolution technique in order to implement a relatively low code rate for the LDPC code, it is difficult to implement an LDPC code having a degree distribution representing the best performance due to various restrictions, such as a cycle structure on a factor graph and hardware implementation.

As mobile communication systems develop, various transmission schemes such as a Hybrid Automatic Retransmission Request (HARQ) scheme and an Adaptive Modulation and Coding (AMC) scheme are used to increase efficiency of resources. A description will now be made of the HARQ scheme and the AMC scheme.

A communication system employing the HARQ scheme must create codes having various code rates using one component code. That is, the HARQ scheme increases its efficiency using a soft combining scheme. The soft combining scheme is classified into a Chase Combining (CC) scheme and an Incremental Redundancy (IR) scheme. In the CC scheme, a transmission side uses the same data for both initial transmission and retransmission. That is, in the CC scheme, if m symbols were transmitted as one coded block at the initial transmission, the same m symbols are transmitted as one coded block even at retransmission. The term "coded block" refers to user data transmitted for one transmission time interval (TTI). That is, in the CC scheme, the same code rate is used for both the initial transmission and retransmission. Then, a reception side soft-combines an initially-transmitted coded block with the retransmitted coded block, and performs a Cyclic Redundancy Check (CRC) operation on the soft-combined coded block to determine whether there is an error in the soft-combined coded block.

In the IR scheme, however, a transmission side uses data in different formats for the initial transmission and retransmission. For example, if n-bit user data is channel-coded into m symbols, the transmission side transmits only some of the m symbols at the initial transmission, and sequentially transmits the remaining symbols at retransmission. That is, in the IR scheme, different code rates are used for the initial transmission and retransmission. Then, a reception side configures coded blocks having a high code rate by concatenating retransmitted coded blocks to the end of the initially-transmitted coded bocks, and then performs error correction. In IR, a coded block transmitted at the initial transmission and coded blocks transmitted at the retransmission are identified by their version numbers. For example, a coded block retransmitted at initial transmission is assigned a version number #1, a coded block transmitted at first transmission is assigned a version number #2, and a coded block transmitted at second retransmission is assigned a version number #3, and the reception side can soft-combine the initially-transmitted coded block with the retransmitted coded block using the version numbers.

The AMC scheme adaptively selects a modulation scheme and a coding scheme used for each channel according to a channel response characteristic of each channel. The term "coding scheme" refers to a scheme for selecting, for example, a code rate. The AMC scheme has a plurality of modulation schemes and a plurality of coding schemes, and modulates and codes a signal by combining the modulation schemes and the coding schemes. Commonly, combinations of the modulation schemes and the coding schemes are called "Modulation and Coding Scheme (MCS)," and can be defined into a plurality of MCSs with level #1 to level #N. That is, the AMC scheme adaptively selects a level of MCS according to a channel response characteristic between a transmission side, or a Base Station (BS), and a reception side, or a Subscriber Station (SS), thereby improving system efficiency.

As described above, when the HARQ and AMC schemes are used, it is necessary to support various code rates. However, because the LDPC code has limitations in terms of code rate as described above, it is hard to use the HARQ and AMC schemes for the LDPC code. Thus, there is a demand for a channel encoding/decoding scheme capable of supporting various code rates using the LDPC code.

SUMMARY OF THE INVENTION

It is, therefore, an object of the present invention to provide a channel encoding/decoding apparatus and method using a parallel concatenated LDPC code.

It is another object of the present invention to provide a channel encoding/decoding apparatus and method using a parallel concatenated LDPC code, being capable of supporting a variable code rate.

It is further another object of the present invention to provide an interleaving apparatus and method for a channel coding apparatus for improving performance of a parallel concatenated LDPC code.

In accordance with a first aspect of the present invention, there is provided a channel coding apparatus using a parallel concatenated low density parity check (LDPC) code. The channel coding apparatus includes a first LDPC encoder for generating a first component LDPC code according to information bits received; an interleaver for interleaving the information bits according to a predetermined interleaving rule; a second LDPC encoder for generating a second component LDPC code according to the interleaved information bits; and a controller for performing a control operation such that the information bits, the first component LDPC code which is first parity bits corresponding to the information bits, and the second component LDPC code which is second parity bits corresponding to the information bits are combined according to a predetermined code rate.

In accordance with a second aspect of the present invention, there is provided a channel decoding apparatus using a parallel concatenated low density parity check (LDPC) code having information bits and first and second parity bits corresponding to the information bits. The channel decoding apparatus includes a first LDPC decoder for generating a first component LDPC code upon receiving a signal by decoding information updated during previous decoding, output from a second LDPC decoder, and information bits and first parity bits in the received signal; a first exclusive OR (XOR) operator for subtracting the updated information from a signal output from the first LDPC decoder; an interleaver for interleaving a signal output from the first XOR operator according to a predetermined interleaving rule; the second LDPC decoder for generating a second component LDPC code by decoding a signal output from the interleaver; a second XOR operator for subtracting a signal output from the interleaver from a signal output from the second LDPC decoder; a deinterleaver for deinterleaving a signal output from the second XOR operator according to a deinterleaving rule corresponding to the interleaving rule, and outputting the deinterleaved signal to the first LDPC decoder and the first XOR operator; a controller for controlling the interleaving rule and deinterleaving rule; and a code rate controller for performing a control operation such that an output of the first LDPC decoder or an output of the second LDPC decoder are output as final decoded bits according to a predetermined code rate.

In accordance with a third aspect of the present invention, there is provided a channel coding method using a parallel concatenated low density parity check (LDPC) code. The channel coding method includes generating a first component LDPC code according to information bits received; interleaving the information bits according to a predetermined interleaving rule; generating a second component LDPC code according to the interleaved information bits; and performing a control operation such that the information bits, the first component LDPC code which is first parity bits corresponding to the information bits, and the second component LDPC code which is second parity bits corresponding to the information bits are combined and transmitted according to a predetermined code rate.

In accordance with a fourth aspect of the present invention, there is provided a channel decoding method using a parallel concatenated low density parity check (LDPC) code having information bits and first and second parity bits corresponding to the information bits. The channel decoding method includes generating a first component LDPC code upon receiving a signal by decoding information updated during previous decoding, and information bits and first parity bits in the received signal; subtracting the updated information from the first component LDPC code; interleaving a signal acquired by subtracting the updated information from the first component LDPC code according to a predetermined interleaving rule; generating a second component LDPC code by decoding the interleaved signal; subtracting the interleaved signal from the second component LDPC code; deinterleaving a signal acquired by subtracting the interleaved signal from the second component LDPC code according to a deinterleaving rule corresponding to the interleaving rule; and outputting the first component LDPC code or the second component LDPC code as final decoded bits according to a predetermined code rate.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will now be described in detail with reference to the annexed drawings. In the following description, a detailed description of known functions and configurations incorporated herein has been omitted for conciseness.

The present invention proposes an apparatus and method for encoding/decoding a channel signal using a parallel concatenated low density parity check (LDPC) code capable of supporting various code rates. In the various schemes proposed to reliably transmit/receive a large volume of data at high speed, such as a Hybrid Automatic Retransmission Request (HARQ) scheme and an Adaptive Modulation and Coding (AMC) scheme, various code rates must be supported. Therefore, the present invention proposes a channel encoding/decoding apparatus and method using the parallel concatenated LDPC code, being capable of supporting a variable code rate. In order to maximize performance of the parallel concatenated LDPC code, the present invention proposes an interleaving rule between component LDPC codes constituting the parallel concatenated LDPC code.

Figures 1, 2:
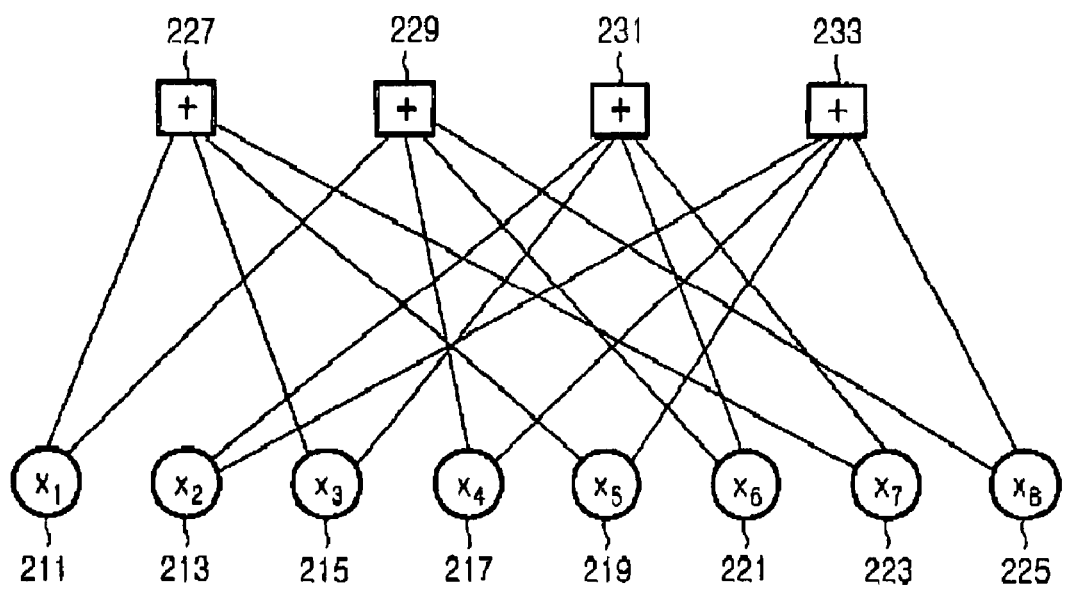
FIG. 1 is a diagram illustrating a parity check matrix of a general (8, 2, 4) LDPC code.
FIG. 2 is a diagram illustrating a factor graph of the (8, 2, 4) LDPC code of FIG. 1.
Figures 3, 4:
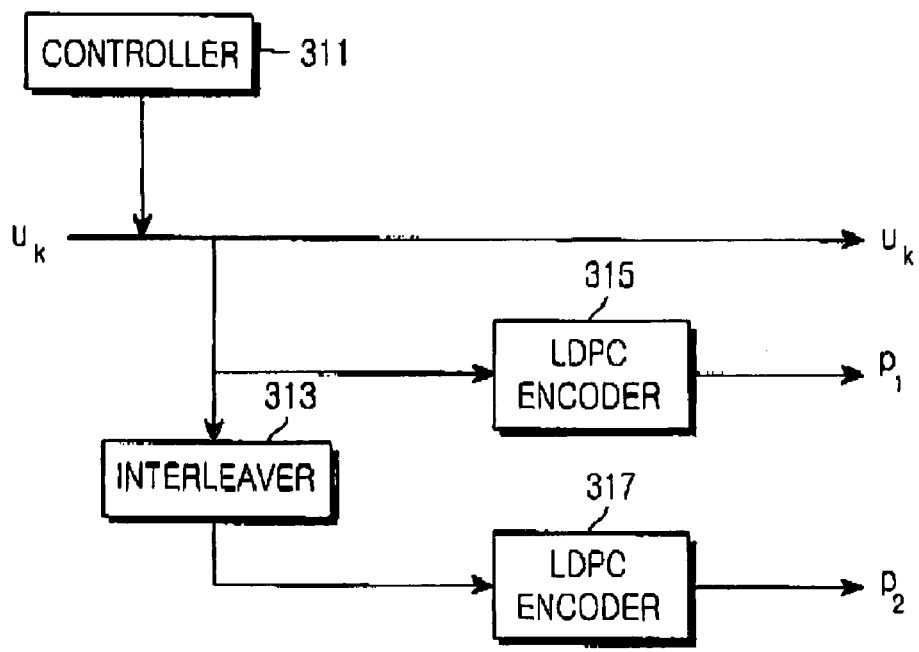
FIG. 3 is a diagram illustrating an internal structure of a channel coding apparatus using a parallel concatenated LDPC code according to an embodiment of the present invention.
FIG. 4 is a diagram illustrating a parity check matrix for the case where the parallel concatenated LDPC code of FIG. 3 is regarded as one LDPC code.

FIG. 3 is a diagram illustrating an internal structure of a channel coding apparatus using a parallel concatenated LDPC code according to an embodiment of the present invention. Referring to FIG. 3, the channel coding apparatus is comprised of a controller 311, an interleaver 313, and LDPC encoders 315 and 317. The channel coding apparatus proposed in the present invention uses a parallel-concatenated structure of an LDPC code like a parallel-concatenated structure of a turbo code, to thereby vary a code rate. Generally, two major factors for determining performance of the turbo code includes selecting a convolutional code to be used as a component code and how to design an interleaver interconnected between component codes. The interleaver has a permutation function, i.e., a function of determining an information bit of another component code to which a particular information bit of one component code is to be mapped. In a channel coding apparatus using the turbo code, if the interleaver is improperly designed, a code having a very short free distance can be generated, exerting a bad influence on code performance. Generally, it is easy to mathematically search for a component code having excellent performance. However, a mathematical approach to design the interleaver is not simple, and when the interleaver is improperly designed, a turbo code generated using the interleaver may be inferior in performance to a turbo code generated using a simple random interleaver.

Performance of the parallel concatenated LDPC code, like performance of the turbo code, chiefly depends upon the design of the interleaver 313. Also, the performance of the parallel concatenated LDPC code, like that of the turbo code, chiefly depends upon how an LDPC code used as a component code is generated. As illustrated, input information bits $u_k$ are provided to the LDPC encoder 315, the interleaver 313, and an output terminal. The LDPC encoder 315 generates first parity bits $p_1$ according to the input information bits $u_k$. Because a process of generating the first parity bits $p_1$ according to the input information bits $u_k$ by the LDPC encoder 315 is not directly related to the present invention, a detailed description thereof will be omitted herein. The interleaver 313 interleaves the input information bits $u_k$ according to a predetermined permutation function, and outputs the interleaved information bits to the LDPC encoder 317. The LDPC encoder 317 generates second parity bits $p_2$ using the interleaved signal output from the interleaver 313. Because a process of generating the second parity bits $p_2$ using the interleaved signal output from the interleaver 313 by the LDPC encoder 317 is not directly related to the present invention, a detailed description will be omitted herein. In addition, an operation of the interleaver 313 will be described herein below.

The controller 311 controls an output of the channel coding apparatus according to a channel condition. For example, when a channel condition is relatively good, the controller 311 performs a control operation such that only the information bits $u_k$ and the first parity bits $p_1$ are transmitted. When the channel condition is relatively poor, the controller 311 performs a control operation such that not only the information bits $u_k$ and the first parity bits $p_1$ but also the second parity bits $p_2$ are transmitted. By controlling the number of transmission bits in this way, the controller 311 can control a code rate. Although the invention has been described with reference to an example in which the controller 311 controls a code rate according to a channel condition, the invention can be applied even to an example in which the controller 311 controls a code rate in a communication system using the HARQ scheme.

The parallel concatenated LDPC code described in connection with FIG. 3 can be regarded as one LDPC code having a parity check matrix. With reference to FIG. 4, a description will now be made of a parity check matrix for the case where the parallel concatenated LDPC code described in conjunction with FIG. 3 is regarded as one LDPC code.

FIG. 4 is a diagram illustrating a parity check matrix for the case where the parallel concatenated LDPC code of FIG. 3 is regarded as one LDPC code. Before a description of FIG. 4 is given, it should be noted that because an LDPC code output from the LDPC encoder 315 and an LDPC code output from the LDPC encoder 317 are regarded as different component codes for the parallel concatenated LDPC code described in connection with FIG. 3 and a reception side performs serial decoding on the component codes, decoding performance of the component codes is different from decoding performance of one LDPC code. A difference between an operation of decoding the parallel concatenated LDPC code and an operation of decoding the LDPC code will be described herein below.

Referring to FIG. 4, an LDPC code output from the LDPC encoder 315 of FIG. 3, which is a first component code, can be expressed as $H_1$ 411 and $P_1$ 413 of a parity check matrix H illustrated in FIG. 4, and in this case, a parity of the LDPC code output from the LDPC encoder 317, which is a second component code, is padded with 0 415. Herein, an LDPC code output from the LDPC encoder 315 will be referred to as a "first component LDPC code," and an LDPC code output from the LDPC encoder 317 will be referred to as a "second component LDPC code." $H_1$ 411 represents a partial matrix corresponding to an information part of the first component LDPC code, and $P_1$ 413 and 0 415 represent partial matrixes corresponding to a parity part of the first component LDPC code. In the embodiment of the present invention, only $P_1$ 413 corresponds to the parity part of the first component LDPC code. Similarly, the LDPC code output from the LDPC encoder 317, which is the second component code, can be expressed as $H_2$ 421 and $P_2$ 425 of the parity check matrix H, and in this case, a parity of the LDPC code output from the LDPC encoder 315, which is the first component code, is padded with 0 423. $H_2$ 421 represents a partial matrix corresponding to an information part of the second component LDPC code, and 0 423 and $P_2$ 425 represent partial matrixes corresponding to a parity part of the second component LDPC code. In the embodiment of the present invention, only $P_2$ 425 corresponds to the parity part of the second component LDPC code.

Because the interleaver 313 performs an interleaving operation according to a predetermined permutation function as described above, a relationship of $H_2 = \pi_1 H_1$ is satisfied. Although it is not necessary that the first component LDPC code should be identical to the second component LDPC code, it is preferable that they are identical to each other when complexity of a reception side's channel decoder is taken into consideration. Therefore, it will be assumed in FIG. 4 that $P_1$ is identical to $P_2$.

Figure 5:
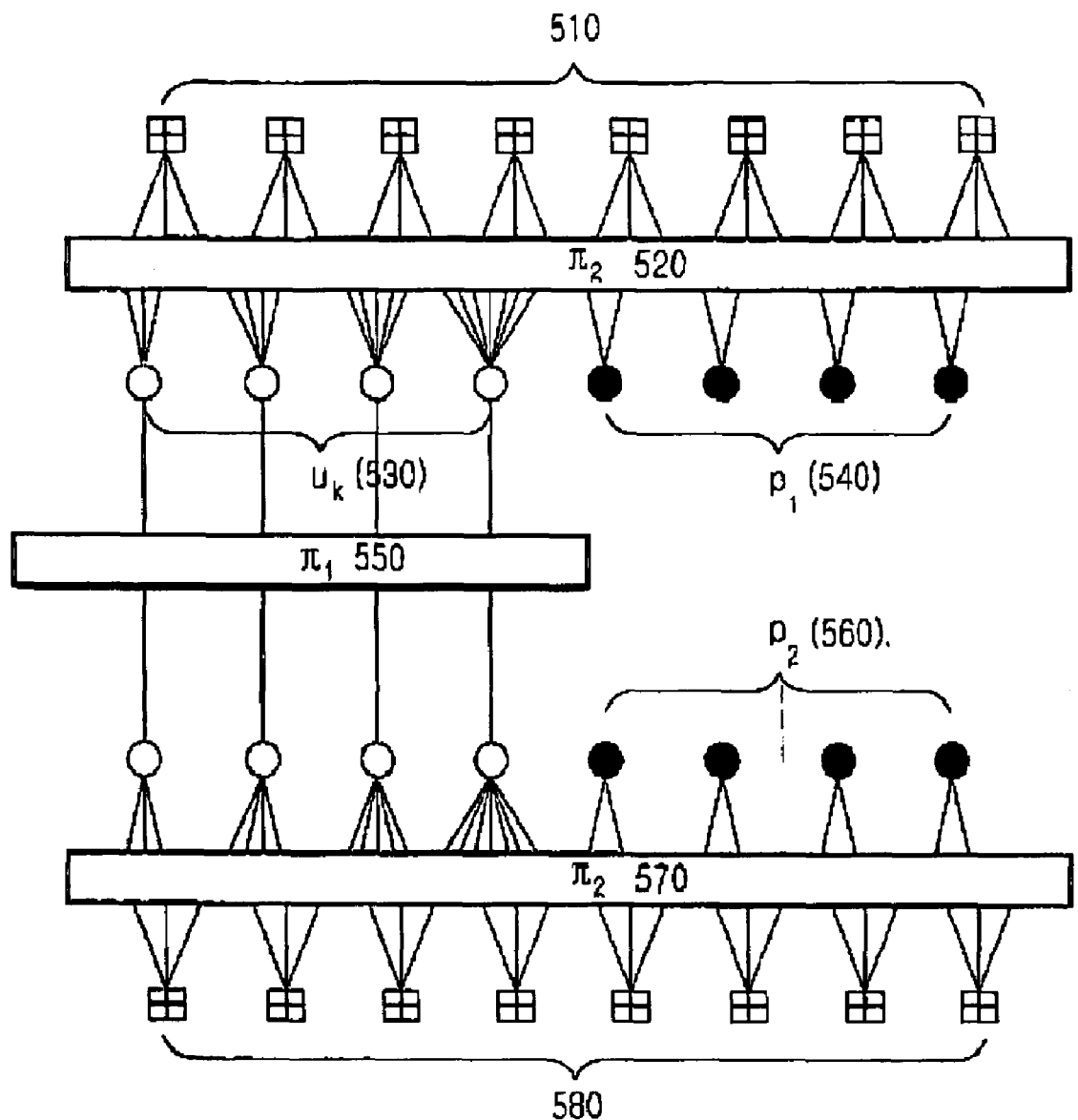
FIG. 5 is a diagram illustrating a factor graph of a parallel concatenated LDPC code that uses the same LDPC codes as component codes.

FIG. 5 is a diagram illustrating a factor graph of a parallel concatenated LDPC code that uses the same LDPC codes as component codes. Referring to FIG. 5, reference numeral 510 denotes check nodes of a first component LDPC code, reference numeral 520 denotes a permutation function $\pi_2$ representing a configuration of a factor graph for the first component LDPC code, reference numeral 530 denotes information bits $u_k$ of the first component LDPC code, and reference numeral 540 denotes first parity bits $p_1$ of the first component LDPC code. The permutation function $\pi_2$ (520) representing a configuration of the first component LDPC code represents how the check nodes are connected to variable nodes, and once the permutation function $\pi_2$ (520) is determined, a parity check matrix of the first component LDPC code can be created. Because a cycle configuration of the factor graph for the first component LDPC code changes according to how the permutation function $\pi_2$ (520) is selected, designing the permutation function $\pi_2$ (520) acts as a very important factor in determining performance of the LDPC code. Because designing the permutation function $\pi_2$ (520) for creating an LDPC code having excellent performance is not directly related to the present invention, a detailed description thereof will be omitted herein.

Further, reference numeral 550 denotes a permutation function $\pi_1$ of the interleaver 313 in FIG. 3, reference numeral 560 denotes second parity bits $p_2$ of the second component LDPC code, reference numeral 570 denotes a permutation function $\pi_2$ representing a configuration of a factor graph for the second component LDPC code, and reference numeral 580 denotes check nodes of the second component LDPC code. Because it is assumed in FIG. 3 that the LDPC encoder 315 is identical to the LDPC code 317, the permutation function $\pi_2$ (570) representing a configuration of the factor graph of the second component LDPC code is also identical to the permutation function $\pi_2$ (520) representing a configuration of the factor graph of the first component LDPC code.

As described with reference to FIG. 5, a factor graph of the parallel concatenated LDPC code has a configuration in which only two component LDPC codes are connected between information bits through an interleaver. Therefore, iterative decoding can be performed in a serial decoding scheme such that a part corresponding to the first component LDPC code is first decoded and when a value of a variable node corresponding to an information part of the first component LDPC code is provided through an interleaver, a part corresponding to the second component LDPC code is decoded.

A detailed description will now be made of a scheme using the parallel concatenated LDPC code in a communication system using the HARQ and AMC schemes.

In a wireless communication system, because power resources of a Base Station (BS) or a Subscriber Station (SS) are limited, it is impossible to transmit signals with maximum transmission power in order to prevent a communication error. The HARQ and AMC schemes are transmission schemes introduced to perform efficient communication using limited power. As described above, the communication system using the HARQ scheme retransmits defective data according to a channel environment using a channel encoder having various code rates for the defective data.

As described above, a code rate of the parallel concatenated LDPC code can vary according to which component LDPC code is to be selected and how many component LDPC codes will be concatenated. The parallel concatenated LDPC code whose code rate can vary is very suitable for the communication system using the HARQ scheme. As described above, performance of the parallel concatenated LDPC code chiefly depends upon how an interleaver connected between LDPC encoders generating component LDPC codes is designed, as well as how a component LDPC code is selected and how many component LDPC codes will be concatenated. Therefore, the present invention proposes a rule of designing the interleaver.

As described above, a cycle having a short length in a factor graph of an LDPC code acts as a major factor of performance degradation of the LDPC code for the following reasons. Because information on a particular node belonging to a cycle with a short length, starting therefrom, returns after a small number of iterations, and as the number of iterations increases, the information returns to the corresponding node more frequently, so that the information cannot be correctly updated. Therefore, it is possible to improve performance of the LDPC code by increasing a length of cycles in the factor graph of the LDPC code to be as long as possible and minimizing the number of cycles with a short length.

In addition, as a degree of a variable node is higher and a degree of a check node is lower, performance of the LDPC code can be improved. Generally, a variable node with a high degree has high reliability, and this means that there is low probability that an error will occur in information bits corresponding to a variable node with a high degree. In contrast, compared with a variable node with a high degree, a variable node with a low degree has low probability that an error will occur in information bits corresponding to the variable node with a low degree.

Therefore, the present invention proposes an interleaver design rule for a parallel concatenated LDPC code considering characteristics on cycles of the LDPC code and degrees of the nodes.

Interleaver Design Rule for Parallel Concatenated LDPC Code

Rule 1: A variable node with a low degree having low reliability is mapped to a variable node with a high degree.

Rule 2: A variable node with a short mean cycle length is mapped to a variable node with a long mean cycle length. Herein, the term "mean cycle" refers to a value determined by dividing the sum of lengths of all cycles to which variable nodes belong by the degree.

Rule 3: Variable nodes constituting one short cycle are included in different cycles, i.e., not included in the same cycle, after interleaving.

1) Detailed Description of Rule 1

Variable nodes with a low degree in the first component LDPC code are mapped to variable nodes with a high degree in the second component LDPC code. By doing so, it is possible to increase reliability of variable nodes having high probability that an error will occur in the first component LDPC code. In addition, variable nodes with a low degree in the second component LDPC code are mapped to variable nodes with a high degree in the first component LDPC code.

2) Detailed Description of Rule 2

An actual communication system is not required to calculate all cycles of all complement LDPC codes in order to apply Rule 2. Therefore, in order to apply Rule 2, the communication system is allowed to calculate only the cycles with a short length (for example, shorter than a 10 cycle length of the LDPC code), and variable nodes having many cycles with a short length are mapped to variable nodes having no cycle with a short length.

3) Detailed Description of Rule 3

As described above, variable nodes connected to the cycles with a short length have low reliability. Therefore, in order to improve reliability of the variable nodes, Rule 3 includes the variable nodes in different cycles, thereby reducing dependency of the respective variable nodes. In this case, the variable nodes are mapped to variable nodes with a long mean cycle length, if possible.

A degree distribution of a parity check matrix should be considered together with Rule 1 to Rule 3. A parity check matrix of the parallel concatenated LDPC code, as described in connection with FIG. 4, has one large parity check matrix for an LDPC code. Therefore, when two component LDPC codes are mapped using the interleaver, it is preferable to match an optimal degree distribution of the entire parity check matrix using a density evolution scheme for a multi-edge type LDPC code, proposed by Richardson et al. Because the density evolution scheme is not directly related to the present invention, a detailed description thereof will be omitted herein.

Figure 6:
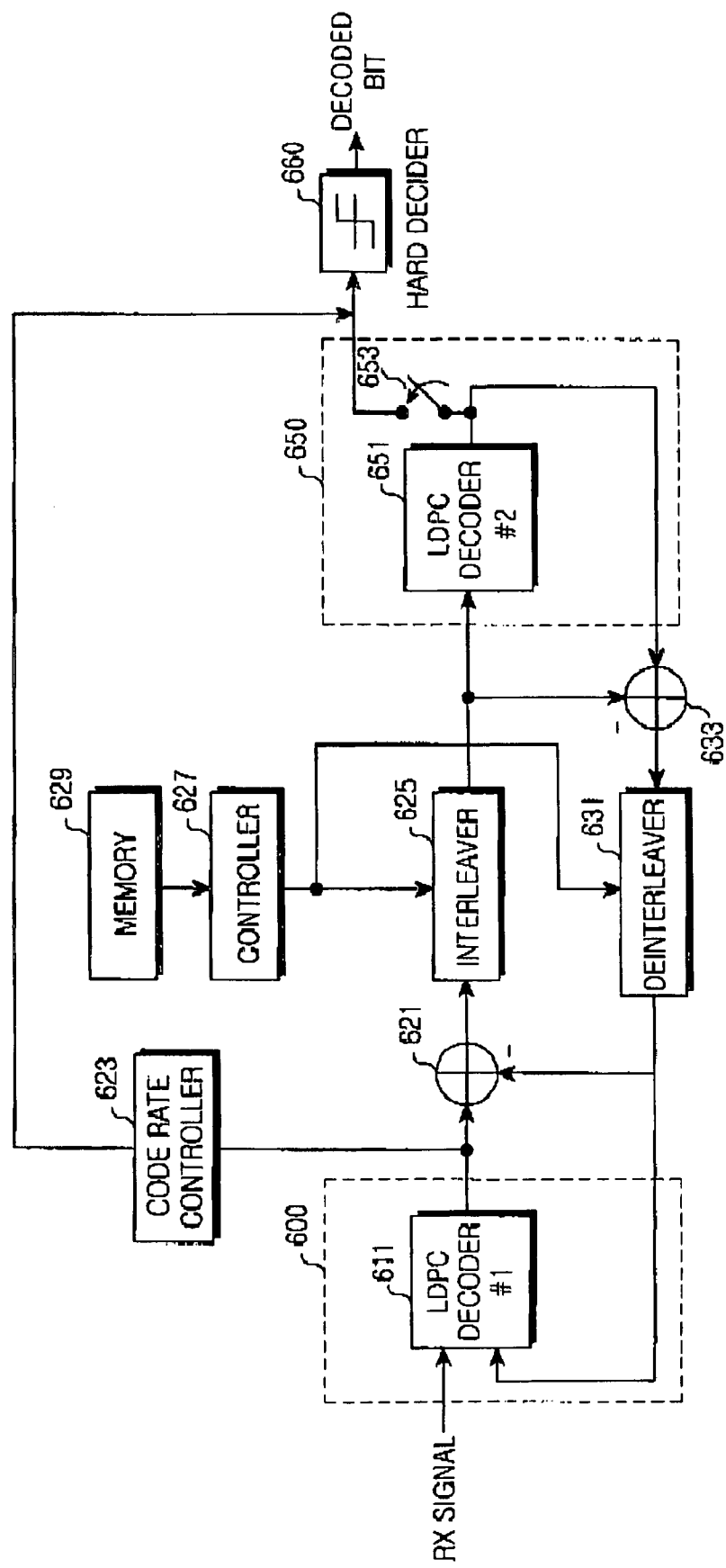
FIG. 6 is a diagram illustrating an internal structure of an apparatus for decoding a parallel concatenated LDPC code according to an embodiment of the present invention.

FIG. 6 is a diagram illustrating an internal structure of an apparatus for decoding a parallel concatenated LDPC code according to an embodiment of the present invention. Referring to FIG. 6, the apparatus for decoding a parallel concatenated LDPC code includes a first component LDPC decoder 600, an exclusive OR (XOR) operator 621, a code rate controller 623, an interleaver 625, a controller 627, a memory 629, a deinterleaver 631, an XOR operator 633, a second component LDPC decoder 650, and a hard decider 660. The first component LDPC decoder 600 is comprised of a first LDPC decoder 611, and the second component LDPC decoder 650 is comprised of a second LDPC decoder 651 and a switch 653.

Information bits $u_k$ and first parity bits $p_1$ in a signal received over a wireless channel are input to the first LDPC decoder 611 in the first component LDPC decoder 600. At the same time, information updated during previous decoding, output from the second LDPC decoder 651, is also input to the first LDPC decoder 611. If the current decoding process is an initial decoding process, the updated information does not exist. In this case, only the information bits $u_k$ and first parity bits $p_1$ are input to the first LDPC decoder 611. The first LDPC decoder 611 performs a decoding operation on the input information bits $u_k$ and first parity bits $p_1$ and the information updated during previous decoding, output from the second LDPC decoder 651, and outputs the decoding result to the XOR operator 621 and the code rate controller 623.

The XOR operator 621 subtracts the information updated during previous decoding, output from the second LDPC decoder 651, from the signal output from the first LDPC decoder 611, and outputs the subtraction result to the interleaver 625. The controller 627 reads a permutation function previously stored in the memory 629, and outputs the read permutation function to the interleaver 625 and the deinterleaver 631 so that the interleaver 625 and the deinterleaver 631 perform an interleaving operation and a deinterleaving operation according to the permutation function. The interleaver 625 interleaves the signal output from the XOR operator 621 according to the permutation function, and outputs the interleaved signal to the second LDPC decoder 651 in the second component LDPC decoder 650 and the XOR operator 633.

The second LDPC decoder 651 decodes the signal output from the interleaver 625, and outputs the decoded signal to the switch 653. Here, only the information bits $u_k$ and second parity bits $p_2$ are input to the second LDPC decoder 651. After the iterative decoding operation is performed a predetermined number of times, the switch 653 is switched on to provide the signal output from the second LDPC decoder 651 to the hard decider 660. Herein, as described above, the switch 653 can be switched on such that the second LDPC decoder 651 is connected to the hard decider 660 after the iterative decoding operation is performed a predetermined number of times. Alternatively, the switch 653 can be switched on such that the second LDPC decoder 651 is connected to the hard decider 660 each time the iterative decoding operation is completed. In the latter case, the decoding apparatus can perform parity check and use the parity check result as a criterion for determining whether to stop the iterative decoding. The code rate controller 623 determines whether to use both of or any one of the first LDPC decoder 611 and the second LDPC decoder 651 according to a code rate. Herein, the code rate controller 623 determines whether to use both of or any one of the first LDPC decoder 611 and the second LDPC decoder 651 according to a code rate used in a channel coding apparatus corresponding to the channel decoding apparatus.

So far, with reference to FIG. 6, a description has been made of an internal structure of the apparatus for decoding a parallel concatenated LDPC code according to an embodiment of the present invention. Next, with reference to FIG. 7, a description will be made of an interleaver design rule based on Rule 1.

Figure 7:
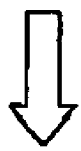
FIG. 7 is a diagram schematically illustrating an interleaver design rule based on Rule 1 according to an embodiment of the present invention.

FIG. 7 is a diagram schematically illustrating an interleaver design rule based on Rule 1 according to an embodiment of the present invention. Before a description of FIG. 7 is given, it should be noted that if a parity check matrix of the parallel concatenated LDPC code is defined as H, the parity check matrix H can be expressed as H=[M|P]. Here, M denotes a part corresponding to information bits, and P denotes a part corresponding to parity bits. In FIG. 7, M denotes a part corresponding to information bits in a parity check matrix of a first component LDPC code, and M' denotes a part corresponding to information bits in a parity check matrix of a second component LDPC code. The part M corresponding to information bits in a parity check matrix of the first component LDPC code and the part M' corresponding to information bits in a parity check matrix of the second component LDPC code have a relationship defined by Equation (1).

$$M' = \pi M \qquad (1)$$

In Equation (1), $\pi$ denotes a permutation function corresponding to an interleaver interconnected between a first LDPC encoder for generating the first component LDPC code and a second LDPC encoder for generating the second component LDPC code. That is, as illustrated in FIG. 3, $\pi$ denotes a permutation function of the interleaver 313 interconnected between the first LDPC encoder 315 and the second LDPC encoder 317. In FIG. 7, columns of the part M corresponding to information bits in a parity check matrix of the first component LDPC code are arranged in ascending order of column weights, and columns of the part M' corresponding to information bits in a parity check matrix of the second component LDPC code are rearranged in descending order of column weights. Herein, the term "weight" refers to the number of non-zero elements. In this case, the permutation function $\pi$ can be expressed as Equation (2):

$$\pi=(8\ 7\ 6\ 5\ 4\ 3\ 2\ 1) \qquad (2)$$

That is, bits input to the first LDPC encoder 315 are rearranged in reverse order, and input to the second LDPC encoder 317. By doing so, the bits with a low weight, having low reliability, are mapped to the bits with a high weight, having high reliability. Although a permutation function $\pi$ can be generated such that it has a particular rule as described in connection with FIG. 7, the permutation function $\pi$ can also be generated such that columns are randomly arranged according to column weights.

Figure 8:
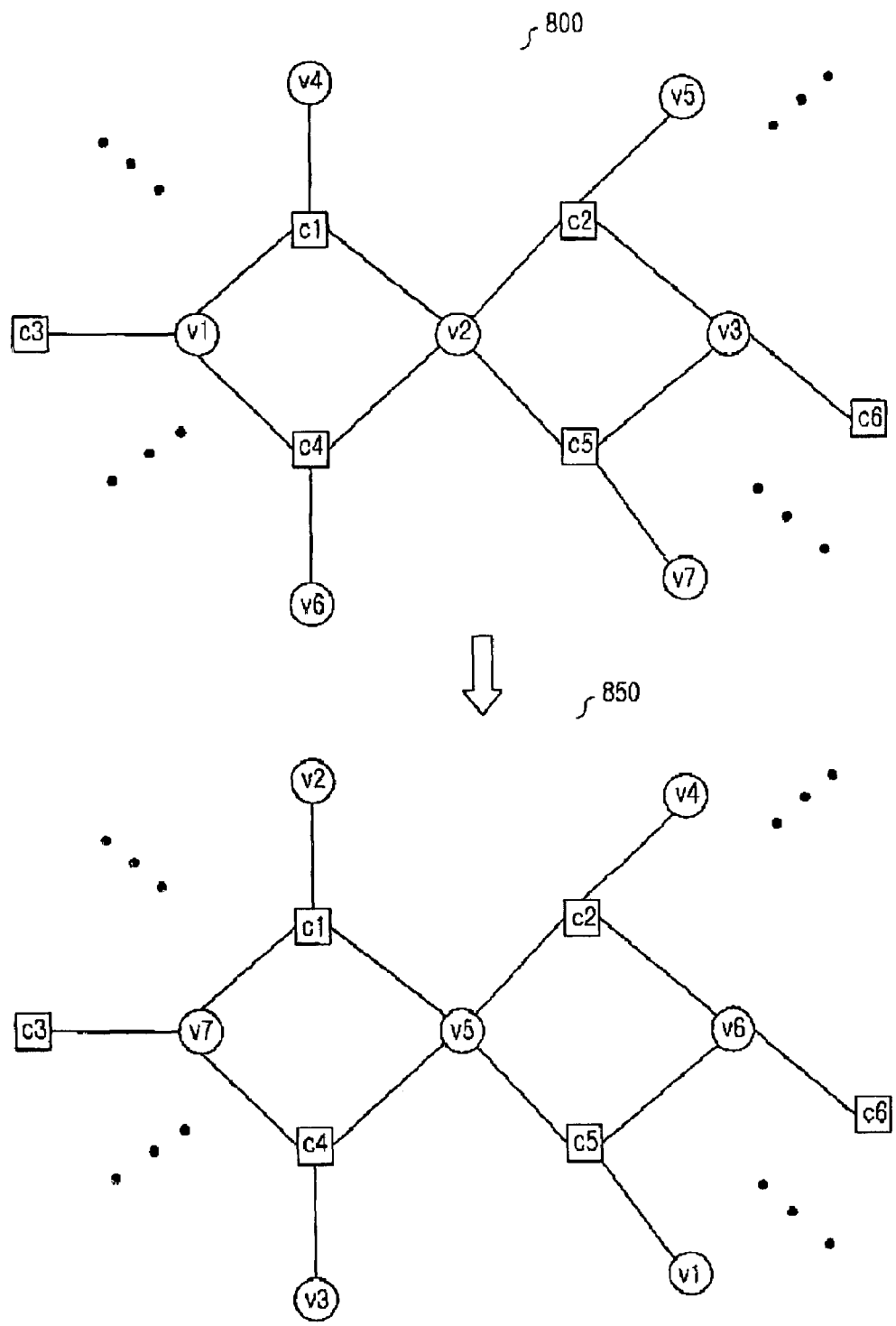
FIG. 8 is a diagram schematically illustrating an interleaver design rule based on Rule 2 and Rule 3 according to an embodiment of the present invention.

FIG. 8 is a diagram schematically illustrating an interleaver design rule based on Rule 2 and Rule 3 according to an embodiment of the present invention. Referring to FIG. 8, reference numeral 800 denotes a part of a factor graph for a first component LDPC code, and reference numeral 850 denotes a part of a factor graph for a second component LDPC code after interleaving of the first component LDPC code. In FIG. 8, circular nodes v1 to v7 represent variable nodes, and rectangular nodes c1 to c6 represent check nodes.

In the factor graph 800 of the first component LDPC code, the variable nodes v1, v2 and v3 have a minimum cycle of a cycle 4. Therefore, it is important to map the variable nodes v1, v2 and v3 to a longer cycle if possible. If it is assumed in FIG. 8 that the omitted external parts in the factor graph 800 of the first component LDPC code represent a very long cycle, the variable nodes v1, v2 and v3 are mapped to the omitted external parts in the factor graph 800 of the first component LDPC code thereby to increase a mean cycle length. In order to consider Rule 2 and Rule 3 together, the variable nodes v1 and v2 connected to the same short cycle should be mapped such that they are not included in the same cycle. Also, the variable nodes v2 and v3 should be mapped such that they are not included in the same cycle.

The interleaver design rule based on Rule 2 and Rule 3 has been described with reference to a factor graph with a relatively small size illustrated in FIG. 8. Actually, however, variable nodes included in the same cycle are mapped such that they are separated as far as possible, so that when a parallel concatenated LDPC code is subjected to iterative decoding, independent information can be acquired. Ideally, when all of the cycles with a short length are considered, performance of the parallel concatenated LDPC code is optimized, but designing the interleaver is then very complicated. Therefore, the actual communication system is allowed to consider only the variable nodes included in a cycle 4 and a cycle 6 in obtaining high performance.

As can be understood from the foregoing description, the present invention enables data transmission/reception without restriction of a code rate using a parallel concatenated LDPC code. In particular, the present invention proposes an interleaver design rule, which is an important factor that determines performance of the parallel concatenated LDPC code, thereby maximizing performance of the parallel concatenated LDPC code.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A channel encoding apparatus comprising:
a first low density parity check (LDPC) encoder of generating a first component LDPC code according to information bits;
an interleaver for interleaving the information bits according to an interleaving rule;
a second LDPC encoder for generating a second component LDPC code according to the interleaved information bits; and
a controller for performing a control operation so the information bits, the first component LDPC code, and the second component LDPC code are combined according to a code rate,
wherein the interleaving rule is one of a plurality of interleaving rules comprising:
a first interleaving rule set so variable nodes with a low degree in a factor graph of the first component LDPC code are mapped to variable nodes with a high degree in a factor graph of the second component LDPC code;
a second interleaving rule set so variable nodes with a low degree in a factor graph of the second component LDPC code are mapped to variable nodes with a high degree in a factor graph of the first component LDPC code;
a third interleaving rule set so variable nodes with a short mean cycle in a factor graph of the first component LDPC code are mapped to variable nodes with a long mean cycle in a factor graph of the second component LDPC code;
a fourth interleaving rule set so variable nodes with a short mean cycle in a factor graph of the second component LDPC code are mapped to variable nodes with a long mean cycle in a factor graph of the first component LDPC code;
a fifth interleaving rule set so variable nodes constituting a cycle with a short length in a factor graph of the first component LDPC code are mapped to variable nodes in a factor graph of the second component LDPC code so the variable nodes are included in different cycles in the factor graph of the second component LDPC code; and
a sixth interleaving rule set so variable nodes constituting a cycle with a short length in a factor graph of the second component LDPC code are mapped to variable nodes in a factor graph of the first component LDPC code so the variable nodes are included in different cycles in the factor graph of the first component LDPC code,
wherein a mean cycle is a value determined by dividing a sum of lengths of all cycles to which the variable nodes belong by a degree thereof, the short mean cycle is a mean cycle length less than or equal to a threshold mean cycle length, the long mean cycle is a mean cycle greater than the threshold mean cycle length, the short length is a cycle length less than or equal to a threshold cycle length, the low degree is a degree less than or equal to a threshold degree, and the high degree is a degree greater that the threshold degree.

2. The channel encoding apparatus of claim 1, wherein the first component LDPC is first parity bits corresponding to the information bits.

3. The channel encoding apparatus of claim 2, wherein the second component LDPC is first parity bits corresponding to the information bits.

4. A channel encoding method comprising:
generating a first component low density parity check (LDPC) code according to information bits;
interleaving the information bits according to an interleaving rule;
generating a second component LDPC code according to the interleaved information bits; and
performing a control operation so the information bits, the first component LDPC code, and the second component LDPC code are combined according to a code rate,
wherein the interleaving rule is one of a plurality of interleaving rules comprising:
a first interleaving rule set so variable nodes with a low degree in a factor graph of the first component LDPC code are mapped to variable nodes with a high degree in a factor graph of the second component LDPC code;
a second interleaving rule set so variable nodes with a low degree in a factor graph of the second component LDPC code are mapped to variable nodes with a high degree in a factor graph of the first component LDPC code;
a third interleaving rule set so variable nodes with a short mean cycle in a factor graph of the first component LDPC code are mapped to variable nodes with a long mean cycle in a factor graph of the second component LDPC code;
a fourth interleaving rule set so variable nodes with a short mean cycle in a factor graph of the second component LDPC code are mapped to variable nodes with a long mean cycle in a factor graph of the first component LDPC code;
a fifth interleaving rule set so variable nodes constituting a cycle with a short length in a factor graph of the first component LDPC code are mapped to variable nodes in a factor graph of the second component LDPC code so the variable nodes are included in different cycles in the factor graph of the second component LDPC code; and
a sixth interleaving rule set so variable nodes constituting a cycle with a short length in a factor graph of the second component LDPC code are mapped to variable nodes in a factor graph of the first component LDPC code so the variable nodes are included in different cycles in the factor graph of the first component LDPC code,
wherein a mean cycle is a value determined by dividing a sum of lengths of all cycles to which the variable nodes belong by a degree thereof, the short mean cycle is a mean cycle length less than or equal to a threshold mean cycle length, the long mean cycle is a mean cycle greater than the threshold mean cycle length, the short length is a cycle length less than or equal to a threshold cycle length, the low degree is a degree less than or equal to a threshold degree, and the high degree is a degree greater that the threshold degree.

5. The channel encoding method of claim 4, wherein the first component LDPC code is first parity bits corresponding to the information bits.

6. The channel encoding method of claim 4, wherein the second component LDPC code is second parity bits corresponding to the information bits.

7. A channel decoding apparatus comprising:
a code rate controller for determining whether to use at least one of a first low density parity check (LDPC) decoder and a second LDPC decoder according to a code rate and a channel condition;
a first LDPC decoder for generating a first component LDPC code upon receiving a first signal by decoding information updated during previous decoding, output from a second LDPC decoder, and information bits and first parity bits in the first received signal, and outputting the first component LDPC code to a first subtractor when the code rate controller determines to use both of the first LDPC decoder and the second LDPC decoder, or generating a first component LDPC code upon receiving a second signal by decoding information bits and first parity bits in the second received signal, and outputting the first component LDPC code to the code rate controller when the code rate controller determines to use the first LDPC decoder;
the first subtractor for subtracting the updated information from a signal output from the first LDPC decoder;
an interleaver for interleaving a signal output from the first subtractor according to an interleaving rule;
the second LDPC decoder for generating a second component LDPC code by decoding a signal output from the interleaver and second parity bits in the first received signal;
a second subtractor for subtracting a signal output from the interleaver from a signal output from the second LDPC decoder;
a deinterleaver for deinterleaving a signal output from the second subtractor according to a deinterleaving rule corresponding to the interleaving rule, and outputting the deinterleaved signal to the first LDPC decoder and the first subtractor;
a controller for controlling the interleaving rule and deinterleaving rule,
wherein the code rate controller outputs the signal output from the first LDPC decoder as final decode bits when the code rate controller determines to use the first LDPC decoder, and the code rate controller controls that second LDPC decoder outputs the second component LDPC code as final decode bits when the code rate controller determines to use both of the first decoder and the second decoder.

8. The channel decoding apparatus of claim 7, wherein the interleaving rule is one of a plurality of interleaving rules comprising:
a first interleaving rule set so variable nodes with a low degree in a factor graph of the first component LDPC code are mapped to variable nodes with a high degree in a factor graph of the second component LDPC code;
a second interleaving rule set so variable nodes with a low degree in a factor graph of the second component LDPC code are mapped to variable nodes with a high degree in a factor graph of the first component LDPC code;
a third interleaving rule set so variable nodes with a short mean cycle in a factor graph of the first component LDPC code are mapped to variable nodes with a long mean cycle in a factor graph of the second component LDPC code;
a fourth interleaving rule set so variable nodes with a short mean cycle in a factor graph of the second component LDPC code arc mapped to variable nodes with a long mean cycle in a factor graph of the first component LDPC code;
a fifth interleaving rule set so variable nodes constituting a cycle with a short length in a factor graph of the first component LDPC code are mapped to variable nodes in a factor graph of the second component LDPC code so the variable nodes are included in different cycles in the factor graph of the second component LDPC code; and
a sixth interleaving rule set so variable nodes constituting a cycle with a short length in a factor graph of the second component LDPC code are mapped to variable nodes in a factor graph of the first component LDPC code so the variable nodes are included in different cycles in the factor graph of the first component LDPC code;

wherein a mean cycle is a value determined by dividing a sum of lengths of all cycles to which the variable nodes belong by a degree thereof, the short mean cycle is a mean cycle length less than or equal to a threshold mean cycle length, the long mean cycle is a mean cycle greater than the threshold mean cycle length, the short length is a cycle length less than or equal to a threshold cycle length, the low degree is a degree less than or equal to a threshold degree, and the high degree is a degree greater that the threshold degree.

9. A channel decoding apparatus comprising:
a first low density parity check (LDPC) encoder of generating a first component LDPC code according to information bits;
an interleaver of interleaving the information bits according to an interleaving rule;
a second LDPC encoder of generating a second component LDPC code according to the interleaved information bits; and
a controller of performing a control operation so the information bits, the first component LDPC code, and the second component LDPC code are combined according to a code rate,
wherein the interleaving rule is one of a plurality of interleaving rules comprising:
a first interleaving rule set so variable nodes with a low degree in a factor graph of the first component LDPC code are mapped to variable nodes with a high degree in a factor graph of the second component LDPC code;
a second interleaving rule set so variable nodes with a low degree in a factor graph of the second component LDPC code are mapped to variable nodes with a high degree in a factor graph of the first component LDPC code;
a third interleaving rule set so variable nodes with a short mean cycle in a factor graph of the first component LDPC code are mapped to variable nodes with a long mean cycle in a factor graph of the second component LDPC code;
a fourth interleaving rule set so variable nodes with a short mean cycle in a factor graph of the second component LDPC code are mapped to variable nodes with a long mean cycle in a factor graph of the first component LDPC code;
a fifth interleaving rule set so variable nodes constituting a cycle with a short length in a factor graph of the first component LDPC code are mapped to variable nodes in a factor graph of the second component LDPC code so the variable nodes are included in different cycles in the factor graph of the second component LDPC code; and
a sixth interleaving rule set so variable nodes constituting a cycle with a short length in a factor graph of the second component LDPC code are mapped to variable nodes in a factor graph of the first component LDPC code so the variable nodes are included in different cycles in the factor graph of the first component LDPC code,
wherein a mean cycle is a value determined by dividing a sum of lengths of all cycles to which the variable nodes belong by a degree thereof, the short mean cycle is a mean cycle length less than or equal to a threshold mean cycle length, the long mean cycle is a mean cycle greater than the threshold mean cycle length, the short length is a cycle length less than or equal to a threshold cycle length, the low degree is a degree less than or equal to a threshold degree, and the high degree is a degree greater that the threshold degree.

10. A channel decoding method comprising:
generating a first component low density parity check (LDPC) code for a first reception signal upon receiving the first reception signal by decoding information updated during previous decoding, and information bits and first parity bits in the first reception signal when a code rate $R_2$ is used in a channel coding apparatus, or generating a first component LDPC code for a second reception signal upon receiving the second reception signal by decoding information bits and first parity bits in the second reception signal when a code rate $R_1$ is used in the channel coding apparatus;
subtracting the updated information from the first component LDPC code for the first reception signal;
interleaving a signal acquired by subtracting the updated information from the first component LDPC code for the first reception signal according to an interleaving rule;
generating a second component LDPC code by decoding the interleaved signal and second parity bits in the first reception signal;
subtracting the interleaved signal from the second component LDPC code;
deinterleaving a signal acquired by subtracting the interleaved signal from the second component LDPC code according to a deinterleaving rule corresponding to the interleaving rule; and
outputting one of the first component LDPC code for the second reception signal and the second component LDPC code as final decoded bits according to a code rate and a channel condition.

11. The channel decoding method of claim 10, wherein the interleaving rule is one of a plurality of interleaving rules comprising:
a first interleaving rule set so variable nodes with a low degree in a factor graph of the first component LDPC code are mapped to variable nodes with a high degree in a factor graph of the second component LDPC code;
a second interleaving rule set so variable nodes with a low degree in a factor graph of the second component LDPC code are mapped to variable nodes with a high degree in a factor graph of the first component LDPC code;
a third interleaving rule set so variable nodes with a short mean cycle in a factor graph of the first component LDPC code are mapped to variable nodes with a long mean cycle in a factor graph of the second component LDPC code;
a fourth interleaving rule set so variable nodes with a short mean cycle in a factor graph of the second component LDPC code are mapped to variable nodes with a long mean cycle in a factor graph of the first component LDPC code;
a fifth interleaving rule set so variable nodes constituting a cycle with a short length in a factor graph of the first component LDPC code are mapped to variable nodes in a factor graph of the second component LDPC code so the variable nodes are included in different cycles in the factor graph of the second component LDPC code; and
a sixth interleaving rule set so variable nodes constituting a cycle with a short length in a factor graph of the second component LDPC code are mapped to variable nodes in a factor graph of the first component LDPC code so the variable nodes are included in different cycles in the factor graph of the first component LDPC code;
wherein a mean cycle is a value determined by dividing a sum of lengths of all cycles to which the variable nodes belong by a degree thereof, the short mean cycle is a mean cycle length less than or equal to a threshold mean cycle length, the long mean cycle is a mean cycle greater than the threshold mean cycle length, the short length is a cycle length less than or equal to a threshold cycle length, the low degree is a degree less than or equal to a threshold degree, and the high degree is a degree greater that the threshold degree.

12. A channel decoding method comprising:

generating a first component low density parity check (LDPC) code for a first reception signal upon receiving the first reception signal by decoding information updated during previous decoding, and information bits and first parity bits in the first received signal when a code rate $R_2$ is used in a channel coding apparatus, or generating a first component LDPC code for a second reception signal upon receiving the second reception signal by decoding information bits and first parity bits in the second reception signal when a code rate $R_1$ is used in the channel coding apparatus;

subtracting the updated information from the first component LDPC code for the first reception signal;

interleaving a signal acquired by subtracting the updated information from the first component LDPC code for the first reception signal according to an interleaving rule;

generating a second component LDPC code by decoding the interleaved signal and second parity bits in the first reception signal;

subtracting the interleaved signal from the second component LDPC code;

deinterleaving a signal acquired by subtracting the interleaved signal from the second component LDPC code according to a deinterleaving rule corresponding to the interleaving rule; and outputting one of the first component LDPC code for the second reception signal and the second component LDPC code as final decoded bits according to a code rate;

wherein the interleaving rule is one of a plurality of interleaving rules comprising:

a first interleaving rule set so variable nodes with a low degree in a factor graph of the first component LDPC code are mapped to variable nodes with a high degree in a factor graph of the second component LDPC code;

a second interleaving rule set so variable nodes with a low degree in a factor graph of the second component LDPC code are mapped to variable nodes with a high degree in a factor graph of the first component LDPC code;

a third interleaving rule set so variable nodes with a short mean cycle in a factor graph of the first component LDPC code arc mapped to variable nodes with a long mean cycle in a factor graph of the second component LDPC code;

a fourth interleaving rule set so variable nodes with a short mean cycle in a factor graph of the second component LDPC code are mapped to variable nodes with a long mean cycle in a factor graph of the first component LDPC code;

a fifth interleaving rule set so variable nodes constituting a cycle with a short length in a factor graph of the first component LDPC code are mapped to variable nodes in a factor graph of the second component LDPC code so the variable nodes are included in different cycles in the factor graph of the second component LDPC code; and a sixth interleaving rule set so variable nodes constituting a cycle with a short length in a factor graph of the second component LDPC code are mapped to variable nodes in a factor graph of the first component LDPC code so the variable nodes are included in different cycles in the factor graph of the first component LDPC code, wherein a mean cycle is a value determined by dividing a sum of lengths of all cycles to which the variable nodes belong by a degree thereof, the short mean cycle is a mean cycle length less than or equal to a threshold mean cycle length, the long mean cycle is a mean cycle greater than the threshold mean cycle length, the short length is a cycle length less than or equal to a threshold cycle length, the low degree is a degree less than or equal to a threshold degree, and the high degree is a degree greater that the threshold degree.

* * * * *